United States Patent [19]
Patrikios
[11] Patent Number: 4,852,788
[45] Date of Patent: Aug. 1, 1989

[54] METHOD AND APPARATUS OF ULTRASONIC GANG WELDING

[75] Inventor: Michael J. Patrikios, Stratford, Conn.
[73] Assignee: American Technology, Inc., Milford, Conn.

[21] Appl. No.: 206,702
[22] Filed: Jun. 16, 1988
[51] Int. Cl.[4] ................ B23K 20/10
[52] U.S. Cl. ................ 228/110; 228/1.1; 228/180.2
[58] Field of Search ................ 228/1.1, 110, 180.2; 156/73.2, 580.2

[56] References Cited

U.S. PATENT DOCUMENTS 3,756,900 9/1973 Michel ................ 228/1.1 X
4,096,348 6/1978 Robillard et al. ................ 228/110 X
4,589,584 5/1986 Christiansen et al. ................ 228/110
4,596,352 6/1986 Knapp ................ 228/1.1

*Primary Examiner*—Kenneth J. Ramsey
*Attorney, Agent, or Firm*—Kramer, Brufsky & Cifelli

[57] ABSTRACT

An ultrasonic welding apparatus adapted to simultaneously weld individual wire ends to individual contacts on a wire connector is disclosed. The apparatus includes an ultrasonic horn having a welding tip attached at one end. An anvil selectively and separately supports the wire ends on the individual wire contacts. A comb is engaged with the anvil for selectively maintaining separation between the adjacent wire ends and the adjacent contacts during ultrasonic welding and for dislodging the wire connector after the wire ends have been welded thereto.

8 Claims, 3 Drawing Sheets

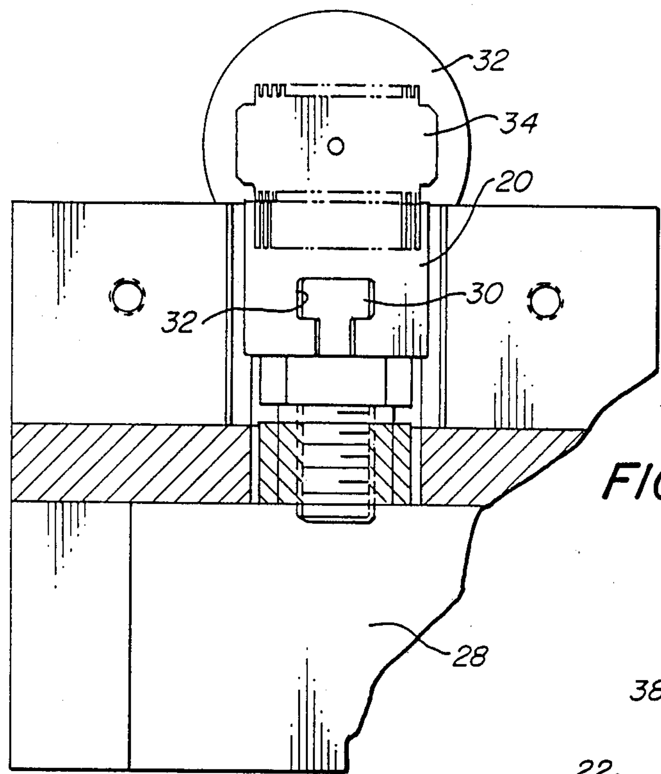
FIG. 2
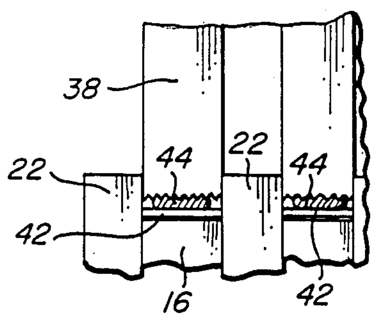
FIG. 5
FIG. 4
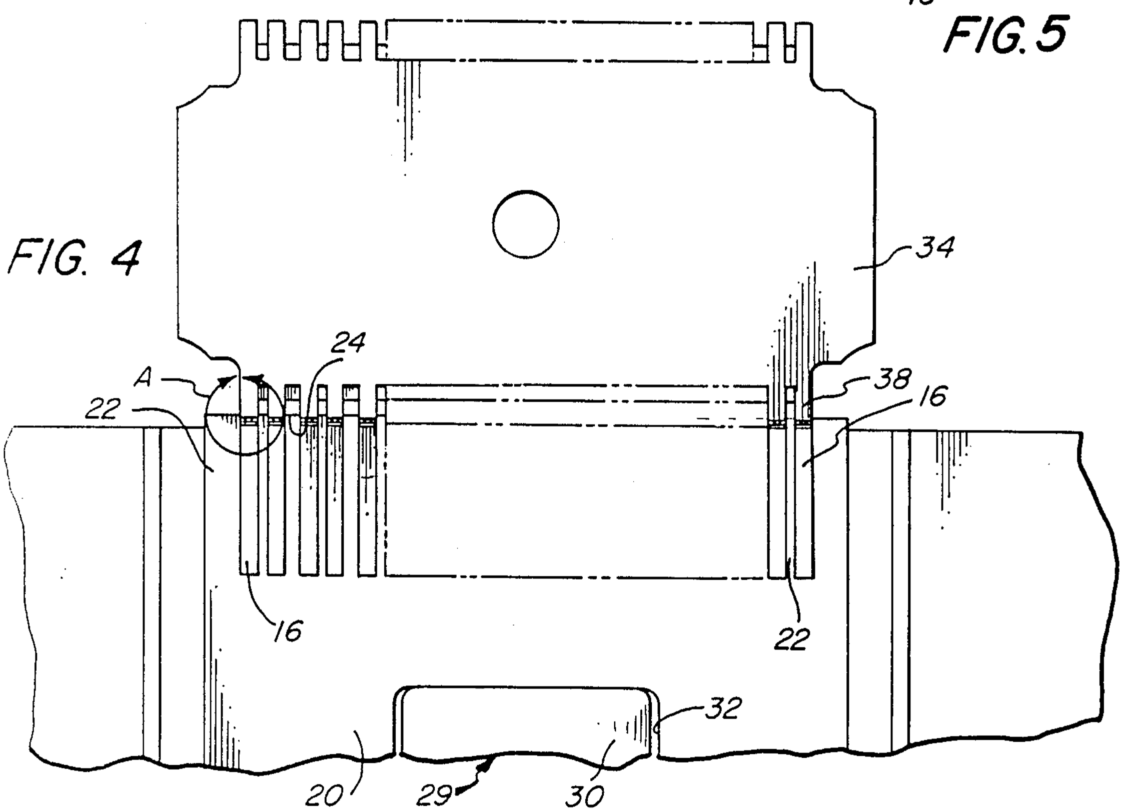

METHOD AND APPARATUS OF ULTRASONIC GANG WELDING

While the invention is subject to a wide range of applications, it is particularly suited for simultaneously ultrasonically welding individual wire ends to individual contacts on a wire connector. In particular, an ultrasonic welding apparatus is provided with a comb-like element for mechanical cooperation with the anvil and the welding tip of the ultrasonic horn whereby individual wires are aligned with individual contacts of the wire connector.

In the past, a wire connector having a plurality of contacts or terminals onto which wires had to be attached was manufactured by the time consuming process of individually soldering each wire to each of the contacts.

Until now, the close tolerances and crowded configurations associated with the wire connectors prevented the welding of the wires to contacts by ultrasonics. The tooling associated with the ultrasonics, such as the anvil and horn, could not be economically manufactured to the precise shape and tolerance required to maintain the separation between the contacts of a wire connector nor provide a sliding fit between the anvil and horn to prevent the wires being welded from being pressed between mating tool parts.

It is a problem underlying the present invention to provide an ultrasonic gang welding apparatus and process of operating the apparatus whereby a plurality of individual wire ends are simultaneously welded to a plurality of individual wire terminals.

It is an object of the present invention to provide an ultrasonic gang welding apparatus and the method of operating the apparatus which obviates one or more of the limitations and disadvantages of the described prior arrangements.

It is a further object of the present invention to provide an ultrasonic gang welding apparatus and the method of operating the apparatus which incorporates relatively inexpensive tooling.

It is a further object of the present invention to provide an ultrasonic gang welding apparatus and the method of using the apparatus which is relatively easy to operate.

It is a still further object of the present invention to provide an ultrasonic gang welding apparatus and the method of using the apparatus which can be readily adapted for many types of ultrasonic welding applications incorporating a plurality of elements which are simultaneously welded together.

Accordingly, there has been provided an ultrasonic gang welding apparatus adapted to simultaneously weld individual wire ends to the contacts of a wire connector. The apparatus includes an ultrasonic horn having a welding tip attached at one end. An anvil separately supports the wire ends on the contacts of the wire connector. A comb-like device mechanically cooperates with the anvil for selectively maintaining separation between adjacent wires and adjacent contacts during ultrasonic welding and for dislodging the wire connector from the anvil after the wire ends have been welded thereto.

BRIEF DESCRIPTION OF THE DRAWINGS

Further objects and advantages of the invention will become apparent from the following description and claims, and from the accompanying drawings, wherein:

FIG. 2 is a cross-sectional view taken substantially along the plane indicated by line 2—2 of FIG. 1 with the welding tip in contact with the anvil and the comb in its fully elevated position;

FIG. 4 is an enlarged view of the projections of the welding tip extending between the teeth of the comb to press a wire and contact against the anvil; and FIG. 5 is a view of section A of FIG. 4.

DETAILED DESCRIPTION OF THE PREFERRED EMBODIMENT

Figure 1:
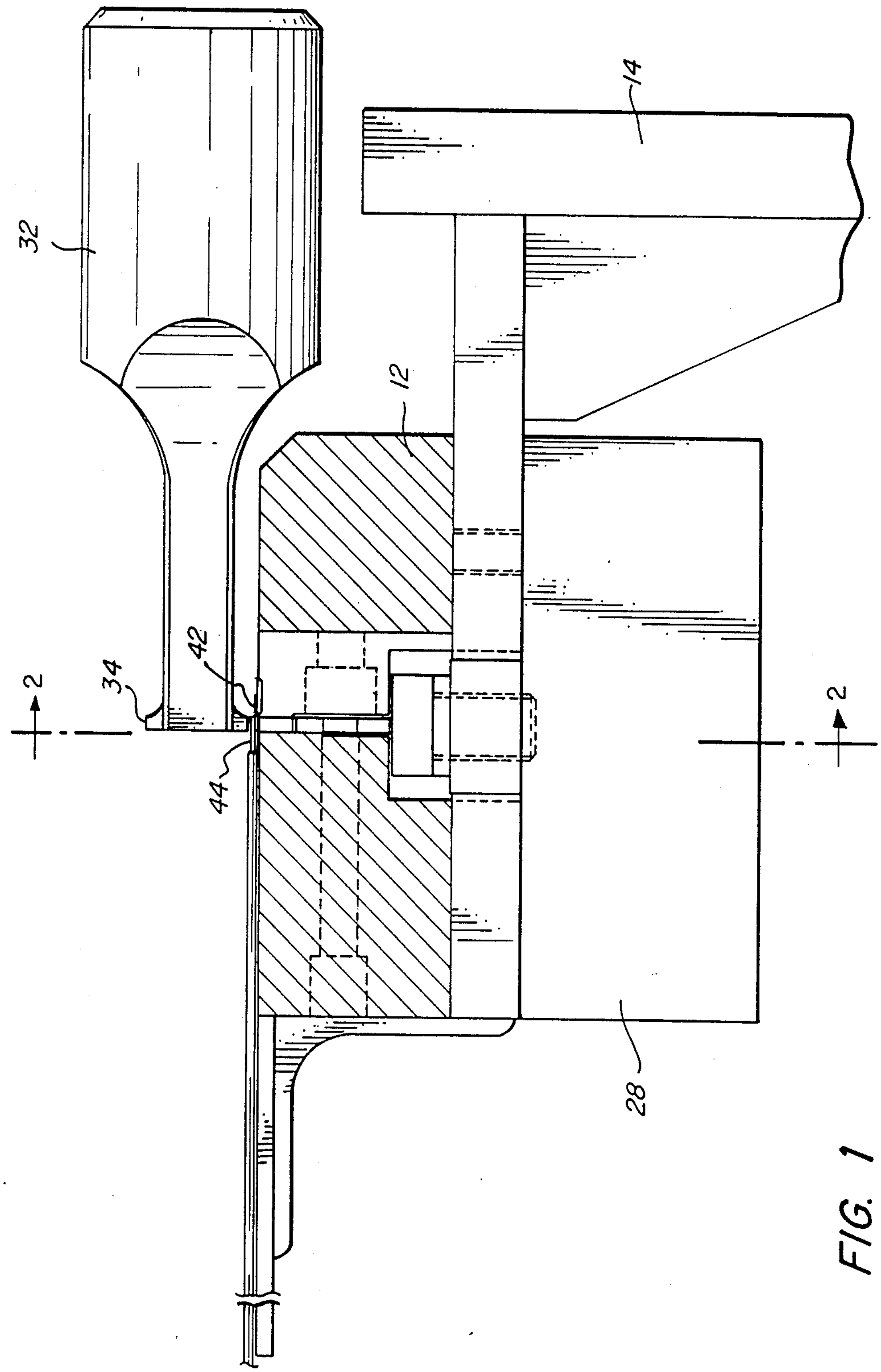
FIG. 1 is a side view in elevation of the preferred embodiment of the apparatus of the present invention.
Figure 3:
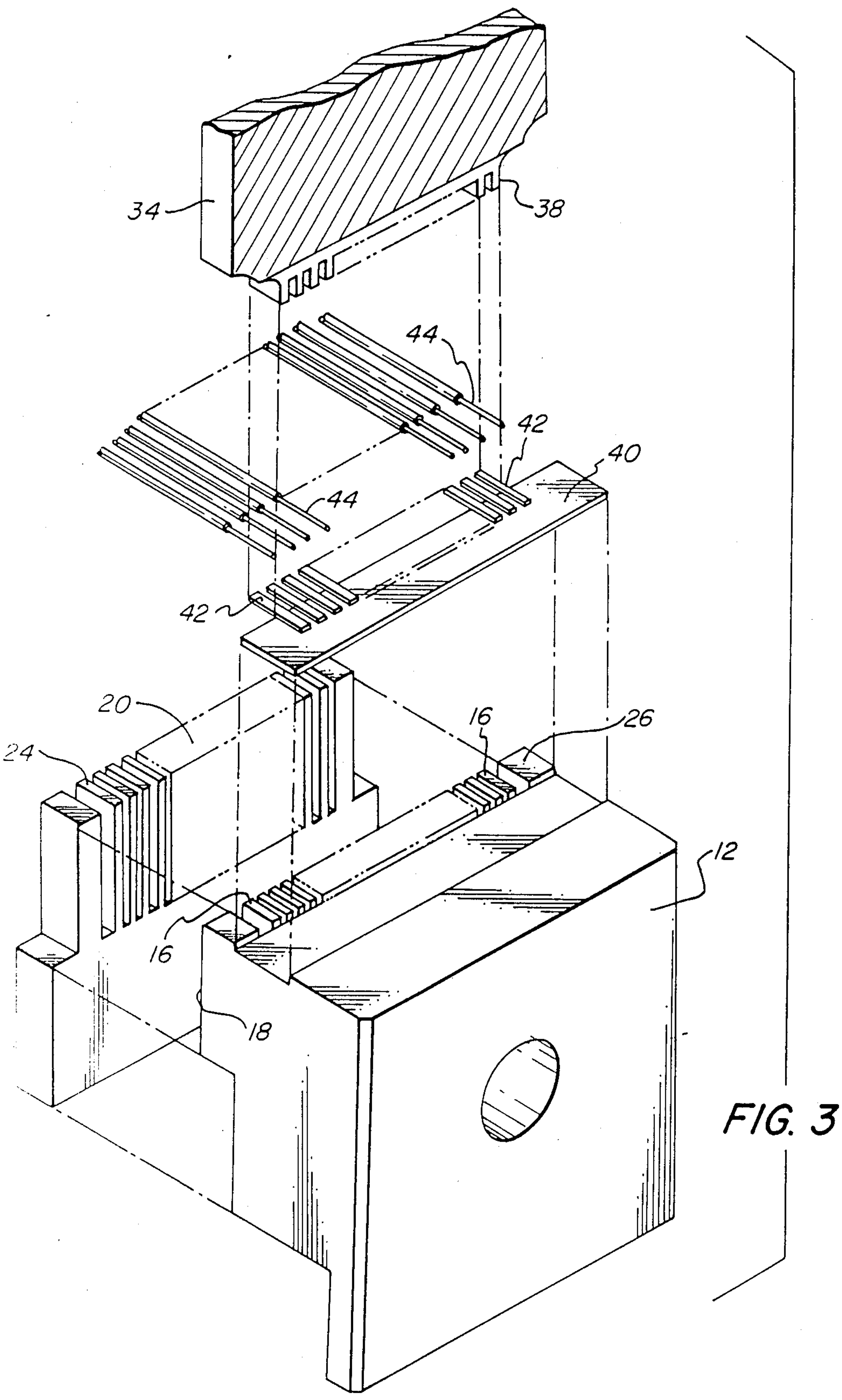
FIG. 3 is an isometric view illustrating the relationship between an anvil, a comb, a welding tip, wire ends and the contacts of a wire connector in accordance with the present invention.

Referring now to the drawings in detail, wherein like elements are indicated by like numbers throughout the several views, a preferred embodiment of the apparatus 10 of the present invention is illustrated in FIGS. 1-5 and includes a stationary anvil 12 firmly attached to a base 14. The anvil 12, as seen in FIG. 3, has a plurality of projections 16 which are spaced apart a fixed distance. The projections 16 extend the height of the anvil wall 18. These projections can be precisely formed in the anvil 12 by using a machining process called electrical discharge machining (EDM). However, it is within the terms of the present invention to form the projections 16 by any other desired manufacturing technique.

A comb 20, as best seen in FIG. 4, has a plurality of teeth 22 spaced so as to form a tight sliding fit between the projections 16 of the anvil 12. The comb 20 reciprocates between a first position, where the ends 24 of the teeth project above the outer surface 26 of the anvil 12, to a second position, where the ends 24 are below the top surface 26. The movement of the comb 20 can be facilitated by any desired means, such as an air actuated cylinder 28 which translates movement to the comb by a connector 29, such as the T-shaped element 30. The element 30 is loosely mounted within a slot 32 formed in the comb 20. The loose fit of connector 29 enables the teeth of the comb to position themselves between the projections 16 of the anvil. This self adjustment is important because of the tight fit between the teeth and the projections.

An ultrasonic welding horn 32 is provided with a welding tip 34 integral therewith. It is, however, within the terms of the present invention to attach a separate welding tip to the end of the horn. The welding tip 34 has a plurality of second projections 38 extending outwardly therefrom. The width of the projections 38 and the spacing therebetween are established to precisely fit between the teeth 22 of the comb 20 when they are projecting above the outer surface 26 of the anvil 12. The projections 38 are preferably formed by the EDM process, although any desired process maya be used.

In operation, a wire connector 40 is disposed on the anvil 12 so that the contacts 42 are supported by the outer surfaces 26 of the projections 16 and are disposed between adjacent walls of the teeth 22. The wire ends 44 are then placed between the teeth 22 of the comb and on top of the wire connector contacts 42.

Simultaneous welding of the wire tips to the contacts is affected by the ultrasonic horn 32 being positioned so that the horn tip 34 engages the comb 20 and the projections 38 are slidably engaged between the upstanding teeth 22. The horn then presses the wire ends 44 and the contacts 42 against the anvil 12. Welding of the wire ends to the contacts is affected by the ultrasonic horn 32 vibrating the tip 34 at a frequency of about 20 kHz parallel to the top surface 26 of the anvil 12. The work surface of the anvil and the tip 36 are preferably serrated so as to firmly grip the wire ends and the contacts of the wire terminal to efficiently transmit the ultrasonic energy.

Because of the precise fit of the projections 38 of the horn 32 between the walls of the teeth 22 of comb 20, the wire ends are not usually able to be pressed into the narrow space between the sidewalls of the teeth and the first projections in the teeth and the second projections. Also, the precision fit enables each wire to be precisely positioned on a contact.

After the weld is completed, the horn 32 is positioned, for example by pivotal movement, so that the tip 34 withdraws from contact with the comb 20. During this time, the connector having the wire ends welded to the contacts remains on the anvil. Next, the comb 20 is moved to the second position where the ends 24 of the teeth 22 are below the working surface 26 of the anvil so that the welded connector is freed. The cycle is completed when the comb returns to the first position where the ends of the teeth project above the working surface 26 of the anvil.

It is apparent that there has been provided in accordance with this invention an apparatus and method for simultaneously welding a plurality of wire ends to contacts of an electrical connector which satisfy the objects, means and advantages set forth hereinbefore. While the invention has been described in combination with the embodiment thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. An ultrasonic welding apparatus adapted to simultaneously, ultrasonically weld individual wire ends to individual contacts on a wire connector, comprising:

an ultrasonic horn having an ultrasonic welding tip means for simultaneously welding the wire ends to corresponding contacts on a wire connector;

anvil means for selectively and separately supporting the individual wire ends on the individual connector contacts;

comb means engaged with said anvil means for selectively maintaining separation between adjacent wire ends and adjacent contacts during ultrasonic welding and for dislodging the wire connector having welded wire contact from said anvil.

2. The ultrasonic welding apparatus of claim 1 wherein said comb means includes a plurality of teeth projecting outward from one side, said teeth being separated from each other by a distance adapted to slidably receive a contact of the wire connector.

3. The ultrasonic welding apparatus of claim 2 wherein said anvil means comprises a plurality of first projections separated by a distance to enable sliding engagement with the teeth of said comb means.

4. The ultrasonic welding apparatus of claim 3 wherein said ultrasonic welding tip means includes a plurality of second projections which fit between said plurality of first projections.

5. The ultrasonic welding apparatus of claim 4 further including means for positioning said comb means between a first position wherein said teeth project above the top surface of said anvil means and a second position wherein said teeth are below the top surface of said anvil means.

6. The method of simultaneously ultrasonically welding individual wire ends to individual contacts on a wire connector, comprising the steps of:

providing an anvil having a plurality of first projections;

providing a comb having a plurality of teeth spaced from each other to enable them to be slidably received between the projections of the anvil;

positioning the teeth of the comb so that they project from the top surface of the anvil;

positioning the individual contacts of the wire connector on the anvil and between the teeth of the comb;

placing the individual wire ends between the teeth of the comb so as to contact the individual connector;

providing an ultrasonic horn having an ultrasonic welding tip, said welding tip having a plurality of projections extending therefrom and being separated from each other a distance to enable sliding engagement between the teeth of said comb;

moving said ultrasonic welding tip whereby the end of the projections presses the individual wires against the contacts which are resting on the anvil; and ultrasonically welding the wires to the contacts.

7. The method of claim 6 further including the step of disengaging the ultrasonic welding tip from between the teeth of the comb.

8. The method of claim 7 further including the step of moving the comb so that the teeth are positioned below the top surface of the anvil to release the wire terminal having the wire ends welded onto the contacts.

* * * * *